(12) United States Patent
Kim et al.

(10) Patent No.: US 6,930,014 B2
(45) Date of Patent: Aug. 16, 2005

(54) METHOD OF FORMING SEMICONDUCTOR DEVICE CAPACITOR BOTTOM ELECTRODE HAVING CYLINDRICAL SHAPE

(75) Inventors: Si-Youn Kim, Seoul (KR); Ki-Jae Hur, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/670,485

(22) Filed: Sep. 24, 2003

(65) Prior Publication Data

US 2004/0129967 A1 Jul. 8, 2004

(30) Foreign Application Priority Data

Jan. 6, 2003 (JP) .................. 10-2003-0000533

(51) Int. Cl.[7] .......................................... H01L 21/8242
(52) U.S. Cl. .................. 438/396; 438/397; 438/253; 438/254; 438/381; 438/238; 438/239; 438/240
(58) Field of Search .................. 438/3, 238–240, 438/253–256, 381, 396–399

(56) References Cited

U.S. PATENT DOCUMENTS

| | | | |
|---|---|---|---|
| 5,943,582 A | 8/1999 | Huang et al. | |
| 6,080,620 A | 6/2000 | Jeng | |
| 6,228,736 B1 | 5/2001 | Lee et al. | |
| 6,235,639 B1 | 5/2001 | Sandhu et al. | |
| 6,239,022 B1 * | 5/2001 | Seo et al. | 438/629 |
| 6,548,853 B1 * | 4/2003 | Hwang et al. | 257/306 |
| 6,624,018 B1 * | 9/2003 | Yu et al. | 438/239 |
| 2003/0017677 A1 | 1/2003 | Yu et al. | |
| 2003/0121132 A1 | 7/2003 | Oh et al. | |

FOREIGN PATENT DOCUMENTS

| | | |
|---|---|---|
| JP | 2001-57413 | 2/2001 |
| KR | 2000-0003232 | 1/2000 |
| KR | 2002-0070730 | 9/2002 |
| KR | 2003-0052760 | 6/2003 |
| KR | 2003-0059357 | 10/2003 |

OTHER PUBLICATIONS

English language of Japanese Patent Publication No. 2001–57413, filed Feb. 2, 2001.
English language Abstract of Korean Patent Publication No. 2002–0070730.
English language abstract of Korean Publication No. 2000–0003232.
English language abstract of Korean Publication No. 2003–0052760.
English language abstract of Korean Publication No. 2003–0059357.

* cited by examiner

Primary Examiner—Nguyen Thanh
(74) Attorney, Agent, or Firm—Marger Johnson & McCollom, P.C.

(57) ABSTRACT

To form a bottom electrode of a capacitor of a semiconductor device, a first insulation layer pattern having a first contact hole is formed on a substrate, and a contact plug for the bottom electrode is formed in the contact hole. A second insulation layer is formed on the first insulation layer pattern and the contact plug. The second insulation layer has a second etching rate higher than a first etching rate of the first insulation layer pattern. The second insulation layer is etched to form a second insulation layer pattern having a second a contact hole exposing the contact plug. A conductive film is formed on the sidewall and the bottom face of the second contact hole. According to the difference between the first etching rate and the second etching rate, the etching of the first insulation layer pattern near the contact plug is reduced.

20 Claims, 10 Drawing Sheets

METHOD OF FORMING SEMICONDUCTOR DEVICE CAPACITOR BOTTOM ELECTRODE HAVING CYLINDRICAL SHAPE

CROSS REFERENCE TO RELATED APPLICATION

This application claims priority under 35 USC § 119 to Korean Patent Application No. 2003-533, filed on Jan. 6, 2003, the contents of which are incorporated herein by reference in their entirety.

BACKGROUND OF THE INVENTION

1. Field of the Invention

This disclosure relates to a bottom electrode of a capacitor of a semiconductor device and a method of forming the same, and more particularly to a bottom electrode of a cylindrical shaped capacitor and a method of forming the same.

2. Description of the Related Art

As computers have been widely used in recent years, demands for semiconductor devices have been increased. Accordingly, semiconductor devices with high response speeds and high storage capacities are required. To meet these needs, semiconductor device fabrication techniques have been developed that improve integration density, response speeds, and reliability.

For example, a semiconductor device like a dynamic random access memory (DRAM) device has large storage capacity while information data is freely inputted and/or outputted into and/or from the DRAM device. The DRAM device generally includes a memory cell that stores the information data as the form of charges, and a peripheral circuit area that controls the information data. The memory cell of the DRAM device usually includes one access transistor and one accumulation capacitor.

To achieve highly integrated DRAM devices, various researches have been made on the formation of a capacitor in a minute memory cell thereof so that the DRAM device has sufficient storage capacity. The capacitor may be formed using several methods that ensure sufficient storage capacity. Usually, they involve using a high permittivity material as a dielectric layer or increasing the effective area of the capacitor by employing a hemisphere silicon grain (HSG) growth process.

However, the HSG growth process demands complicated and costly steps, decreasing the productivity of the DRAM devices. Additionally, when a high permittivity material is used as a dielectric layer, the productivity of the DRAM device may also decrease due to process variations when the capacitor is formed.

Accordingly, a method of increasing the height of the capacitor and a method of varying the shape of the capacitor have been developed to obtain sufficient storage capacity of the DRAM device. In these methods, the height and shape of the capacitor are varied while the horizontal size of the capacitor is maintained. For example, a bottom electrode with a fin shape or a cylindrical shape may be provided.

The height of the capacitor is more than about 15,000 Å for a recent Giga-graded DRAM device. Thus, a cylindrical shaped capacitor having a height of more than 15,000 Å is employed to ensure the sufficient storage capacity of the DRAM device.

U.S. Pat. No. 6,228,736 (issued to Lee et. al.) and U.S. Pat. No. 6,080,620 (issued to Jeng) disclose cylindrical shaped capacitors. Generally, when the height of the capacitor increases, the bottom electrode of the capacitor may collapse during the capacitor fabrication process. In particular, the collapse of the bottom electrode frequently occurs when the capacitor has a cylindrical shape because the capacitor exhibits an increasingly unstable structure as the height increases.

Japanese Patent Laid-Open Publication No. 13-57413 discloses a cylindrical shaped capacitor having an improved bottom electrode structure.

Figure 1:
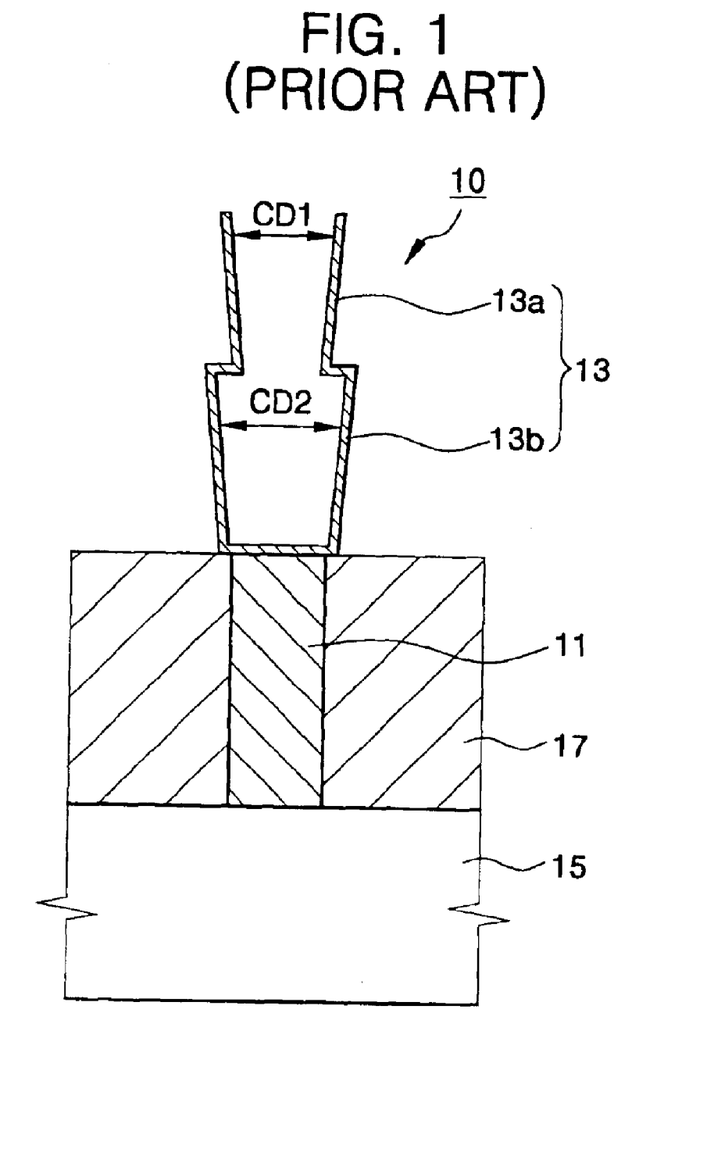
FIG. 1 is a schematic cross-sectional diagram illustrating a bottom electrode of a conventional cylindrical shaped capacitor.

FIG. 1 is a schematic cross-sectional diagram illustrating a bottom electrode of a conventional cylindrical shaped capacitor.

Referring to FIG. 1, the bottom electrode 10 of a cylindrical shaped capacitor formed on a substrate 15 has a contact plug 11 formed through an insulation layer pattern 17, and a node 13 connected to the contact plug 11. A pad (not shown) is positioned beneath the contact plug 11.

The node 13 of the bottom electrode 10 is divided into an upper node 13a and a lower node 13b on the basis of their critical dimensions (CD). Here, the critical dimension (CD2) of the lower node 13b is larger than the critical dimension (CD1) of the upper node 13a. When the critical dimension (CD2) of the lower node 13b is larger than the critical dimension (CD1) of the upper node 13a, the cylindrical shaped capacitor structure may be improved.

Figure 2A:
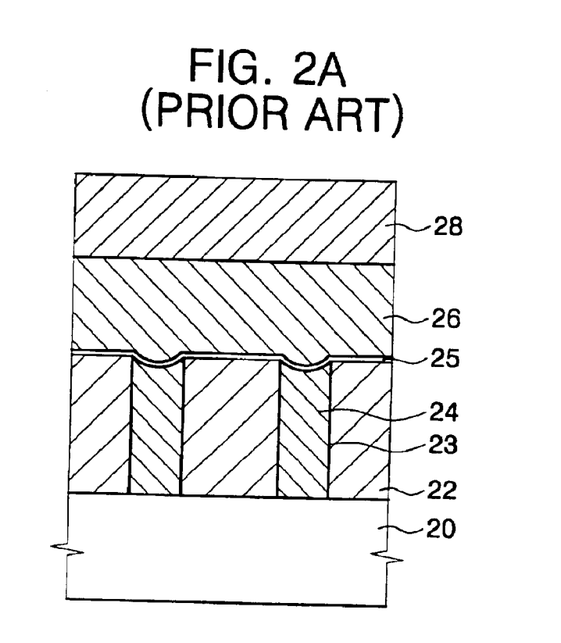
FIGS. 2A and 2B are cross-sectional diagrams illustrating a conventional method of forming the bottom electrode of a cylindrical shaped capacitor.
Figure 2B:
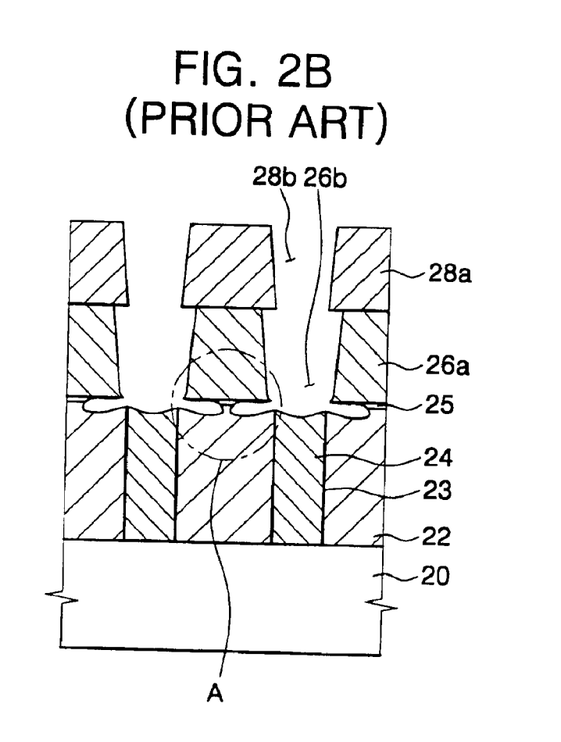

FIGS. 2A and 2B are cross-sectional diagrams illustrating a conventional method of forming a bottom electrode of a cylindrical shaped capacitor.

Referring to FIG. 2A, after a first insulation layer is formed on a substrate 20, the first insulation layer is patterned to form a first insulation layer pattern 22 having a first contact hole 23.

A conductive material is deposited on the first insulation layer pattern 22 to fill up the first contact hole 23 so that a contact plug 24 for the bottom electrode is formed in the first contact hole 23. Here, the contact plug 24 is electrically connected to a pad (not shown) for the bottom electrode. In other words, the contact plug 24 is formed on the pad.

An etch stop layer 25, a second insulation layer 26 and a third insulation layer 28 are sequentially formed on the first insulation layer pattern 22 and on the contact plug 24. The second insulation layer 26 is formed using a material with an etching rate different from that of the third insulation layer 28.

Referring to FIG. 2B, the third insulation layer 28 is etched to form a third insulation layer pattern 28a having a third contact hole 28b. The portion of the second insulation layer 26 exposed through the third insulation layer pattern 28a is etched to form a second insulation layer pattern 26a having a second contact hole 26b exposing the contact plug 24. The third insulation layer pattern 28a and the second insulation layer pattern 26a are formed by in-situ processes. The etch stop layer 25 is etched when the second insulation layer pattern 26a is formed.

The surface of the contact plug 24 is exposed when the second insulation layer pattern 26a and the third insulation layer pattern 28a are formed. The critical dimension of the second contact hole 26b of the second insulation layer pattern 26a is larger than the critical dimension of the third contact hole 28b of the third insulation layer pattern 28a because the etching rate of the second insulation layer 26 is greater than that of the third insulation layer 28.

Unfortunately, part of the first insulation layer pattern 22 formed on an upper lateral portion (region A) of the contact plug 24 is etched as well. In other words, the upper lateral portion (region A) of the contact plug 24 is etched because the etching rate of the third insulation layer 28 is different from that of the second insulation layer 26. Also, the upper lateral portion (region A) of the contact plug 24 is damaged when the third insulation layer 28 and the second insulation layer 26 are cleaned after the etching process.

During the etching and cleaning processes, the upper lateral portion of the contact plug may be damaged. More specially, an electrical bridge may be generated between adjacent contact plugs when a conductive film for the bottom electrode is formed thereon. If a bridge is generated between the contact plugs, the reliability of a semiconductor device, including the bottom electrode is seriously deteriorated. Embodiments of the invention address these and other disadvantages of the prior art.

SUMMARY OF THE INVENTION

Among other advantages, embodiments of the invention provide a bottom electrode for a capacitor in a semiconductor device that includes a protection layer pattern that prevents the formation of a bridge between adjacent contact plugs. Embodiments of the invention also provide a bottom electrode having an enhanced cylindrical shape, thereby improving the electrical characteristics and increasing the stability of a capacitor.

BRIEF DESCRIPTION OF THE DRAWINGS

The above and other features and advantages of the invention will become readily apparent by reference to the following detailed description when considered in conjunction with the accompanying drawings.

DETAILED DESCRIPTION OF THE INVENTION

The invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. The relative thickness of layers in the illustrations may be exaggerated for purposes of describing the present invention.

FIGS. 3A to 3E are cross-sectional diagrams illustrating a method of forming a bottom electrode of a cylindrical shaped capacitor according to an embodiment of the present invention.

Figure 3A:
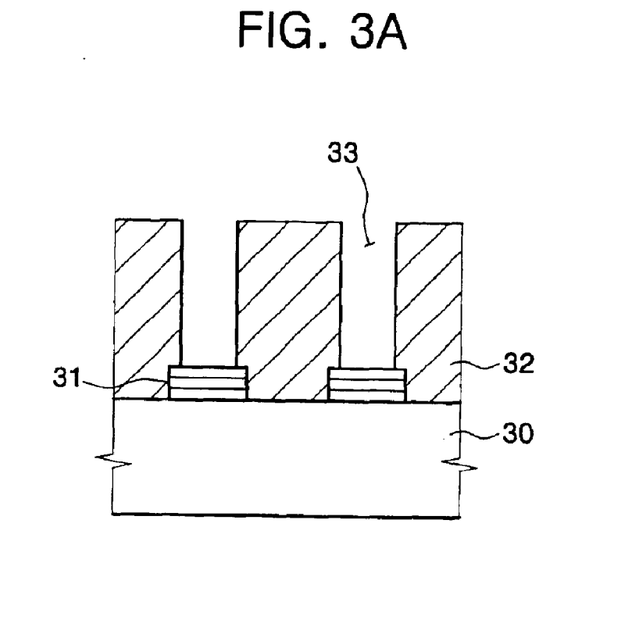
FIGS. 3A to 3E are cross-sectional diagrams illustrating a method of forming the bottom electrode of a cylindrical shaped capacitor according to an embodiment of the invention.

Referring to FIG. 3A, there is provided a substrate 30 having pads 31 for bottom electrodes of capacitors. The pads 31 are formed in contact regions between gate electrodes (not shown). Each of the pads 31 serves as an electric channel between the bottom electrode of the capacitor and the substrate 30.

A first insulation layer is formed on the substrate 30 having the pad 31 formed thereon. For example, the first insulation layer is formed using borophosphosilicate glass (BPSG). When the first insulation layer corresponds to a BPSG film, the first insulation layer has an etching selectivity relative to a second insulation layer that is subsequently formed. The BPSG film is preferably about 3.5 to 4.5% by weight of boron (B) and about 3.3 to 3.7% by weight of phosphorous (P).

The first insulation layer on the substrate 30 is etched to form first insulation layer patterns 32 having first contact holes 33 exposing the pads 31. The first insulation layer patterns 32 are formed by a photolithography process.

When the first insulation layer patterns 32 are formed, contaminant particles are generated. The contaminants may remain on the first insulation layer patterns 32 after forming the first insulation layer patterns 32. If the contaminants remain on the first insulation layer patterns 32, a failure of the semiconductor device may result during subsequent processes.

Accordingly, a cleaning process is advantageously performed after the first contact holes 33 are formed. The cleaning process includes a wet cleaning process using a standard cleaning 1 (SC-1) solution or a hydrogen fluoride (HF) solution. In this case, the SC-1 solution includes ammonium hydroxide ($NH_4OH$), hydrogen peroxide ($H_2O_2$) and deionized water ($H_2O$) by a volume ratio of about 1:1:5. Though the two solutions can be used independently, it is preferable to sequentially use the HF solution and then the SC-1 solution during the cleaning process. In the cleaning process, the substrate 30 is cleaned using the HF solution for about 100 seconds, and the substrate 30 is then successively cleaned using the SC-1 solution for about 180 seconds.

When the cleaning process is accomplished, the critical dimension (CD) of the first contact hole 33 increases while the height of the first insulation layer pattern 32 decreases because the first insulation layer pattern 32 is somewhat etched.

When structures like bit lines (not shown) are formed under the first insulation layer patterns 32, portions of the structures may be exposed after the cleaning process. Particularly, portions of the structures may be seriously exposed near the sidewalls of the first contact holes 33. Thus, failures such as pattern bridges may occur in accordance with the exposure of the structures like the bit lines.

Considering the above-mentioned problem, spacers may be advantageously formed on the sidewall of the first contact holes 33 after the cleaning process. In this case, the spacer may be formed as follows.

A thin film for the spacers is continuously formed on the sidewalls and bottom faces of the first contact holes 33 and on the first insulation layer patterns 32. For example, the thin film for the spacers includes a silicon nitride film or an oxide film. Though these films may be independently formed to complete the thin film for the spacers, the oxide film and the silicon nitride film are alternatively formed in sequence to complete the thin film for the spacers. Here, the oxide film may include middle temperature oxide (MTO).

The thin film is etched to remove portions of the thin film positioned on the first insulation layer patterns 32 and on the bottom faces of the first contact holes 33. Hence, the thin film remains only on the sidewalls of the first contact holes 33. The remaining portions of the thin film serve as the spacers.

Figure 3B:
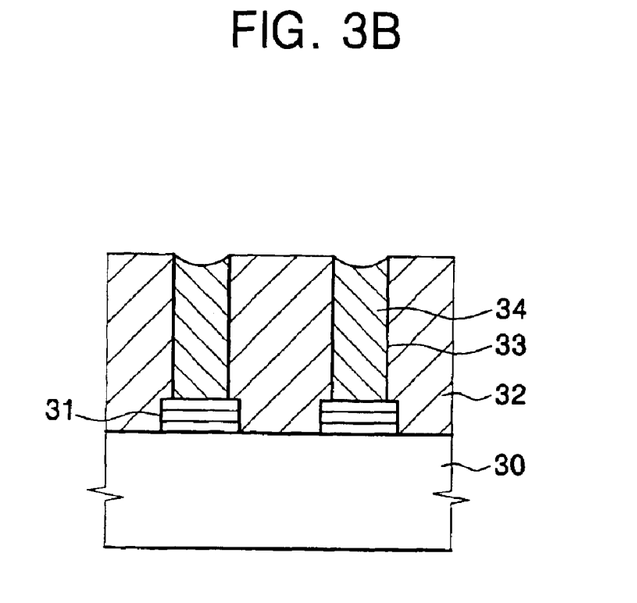

Referring to FIG. 3B, a conductive film composed of a conductive material is deposited on the first insulation layer patterns 32 and fills the first contact holes 33. For example, the conductive material includes polysilicon.

In particular, the conductive film is formed on the first insulation layer patterns 32 having the first contact holes 33 and fills the first contact holes 33. Portions of the conductive film positioned on the first insulation layer patterns 32 are removed. Here, the portions of the conductive film are preferably removed using a chemical mechanical polishing (CMP) process. In the CMP process, a polishing end point is preferably set as the surfaces of the first insulation layer patterns 32. That is, the conductive film is polished by the CMP process until the surfaces of the first insulation layer patterns 32 are exposed. Accordingly, the first contact holes 33 are filled up with the conductive material. When the first contact holes 33 are filled up with the conductive material, contact plugs 34 for the bottom electrodes of the capacitors are formed.

Figure 3C:
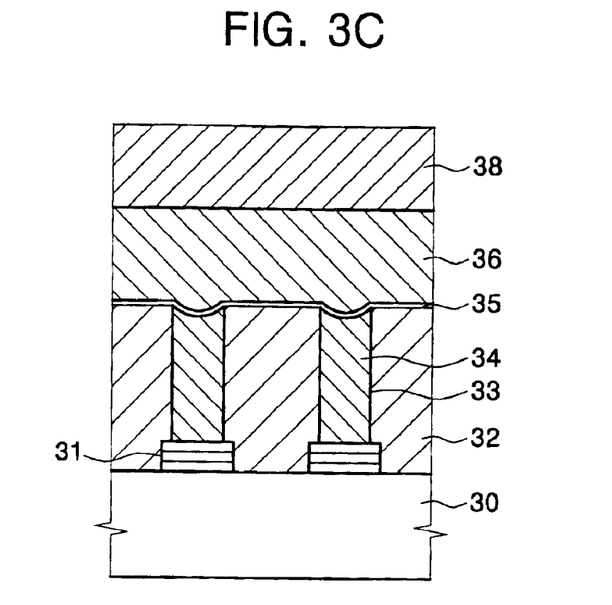

Referring to FIG. 3C, a second insulation layer 36 and a third insulation layer 38 are sequentially formed on the first insulation layer patterns 32 and on the contact plugs 34. When the third insulation layer 38 and the second insulation layer 36 are etched, the first insulation layer patterns 32 may be damaged due to the etching selectivity between the first insulation layer patterns 32 and the second and third insulation layers 36 and 38

Therefore, an etch stop layer 35 is preferably formed on the first insulation layer patterns 32 and on the contact plugs 34. The etch stop layer 35 prevents the first insulation layer patterns 32 from being damaged during the etching process for the third insulation layer 38 and the second insulation layer 36. For example, the etch stop layer 35 includes a silicon nitride film or an oxide film. Though these films may be independently formed to complete the etch stop layer 35, the oxide film and the silicon nitride film are alternatively formed in sequence to complete the etch stop layer 35. The oxide film may include middle temperature oxide (MTO).

When the etching selectivity of the second insulation layer 36 is smaller than that of the first insulation layer patterns 32, the first insulation layer patterns 32 near the upper portions of the contact holes 33 are somewhat etched. When the first insulation layer patterns 32 near the upper portions of the contact holes 33 are etched, a pattern bridge between adjacent contact holes 33 may form. If the pattern bridge is generated, the electrical function of the capacitor may be damaged.

Therefore, the etching selectivity of the second insulation layer 36 is preferably larger than that of the first insulation layer patterns 32. In other words, the etching selectivity of the second insulation layer 36 is preferably higher than that of the first insulation layer patterns 32. For example, the second insulation layer 36 is formed using BPSG. Here, the BPSG is preferably about 2.3 to 2.7% by weight of boron and about 2.25 to 2.65% by weight of phosphorous.

As for the cylindrical shaped bottom electrode of the capacitor formed utilizing a third insulation layer pattern and a second insulation layer pattern, the critical dimension of a lower node is required to have a value larger than that of an upper node in order to prevent the bottom electrode from leaning or collapsing. When the third insulation layer pattern and the second insulation layer pattern are formed using by the etching process for the third insulation layer 38 and the second insulation layer 36, the critical dimension of a second contact hole formed through the second insulation layer pattern is required to have a value larger than that of a third contact hole formed through the third insulation layer pattern. For example, the third insulation layer 38 includes an oxide film like a tetraethylorthosilicate (TEOS) film.

Figure 3D:
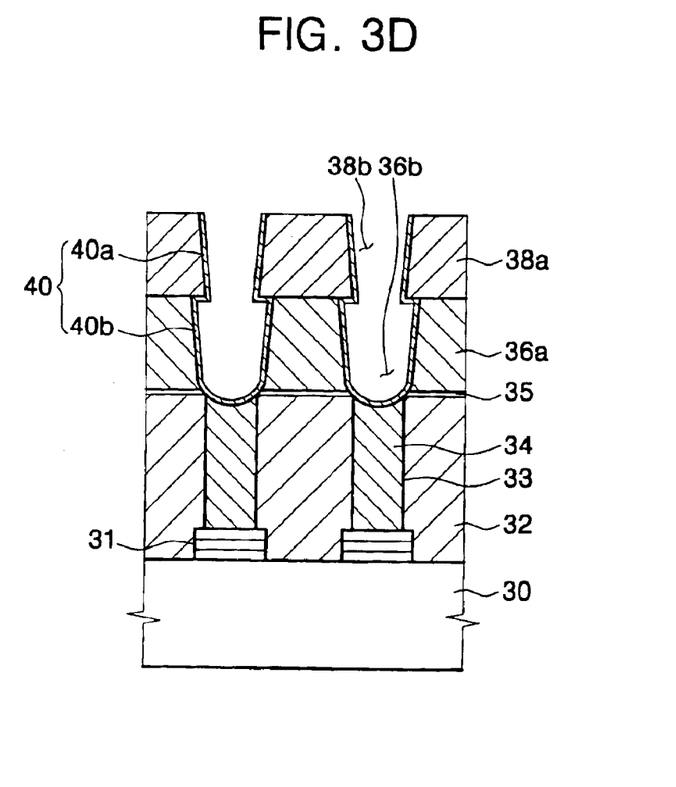

Referring to FIG. 3D, the third insulation layer 38 and the second insulation layer 36 are sequentially etched. The etching process is performed by a photolithography process until the surfaces of the contact plugs 34 are exposed. The second insulation layer 36 is preferably etched to expose the etch stop layer 35. The sequential etching process of the third insulation layer 38 and the second insulation layer 36 is performed by a wet etching process or a dry etching process. The wet etching process is preferably performed using a LAL solution. Here, the LAL solution preferably contains a fluorine compound such as HF or $NH_4F$. In addition, the etching process for the etch stop layer 35 is preferably performed by a wet etching process using a LAL solution or a phosphoric acid solution. When the etch stop layer 35 includes an oxide film, the wet etching process using the LAL solution is advantageously performed. When the etch stop layer 35 includes a silicon nitride film, the wet etching process is adequately performed using the phosphoric acid solution. When the etch stop layer 35 includes a composite film of silicon nitride and oxide, the wet etching process is performed sequentially using the phosphoric acid solution and the LAL solution.

After these etching processes, the third insulation layer 38 and the second insulation layer 36 are respectively patterned into third insulation layer patterns 38a having third contact holes 38b and second insulation layer patterns 36a having second contact holes 36b. Because the etching selectivity of the second insulation layer 36 is adjusted to have the value larger than that of the third insulation layer 38, the critical dimension of the second contact hole 36b formed through the second insulation layer pattern 36a is larger than that of the third contact hole 38b of the third insulation layer pattern 38a. Additionally, the first insulation layer patterns 32 near the upper portions of the contact plugs 34 exposed during the etching process for the second insulation layer 36 are hardly etched because the etching selectivity of the second insulation layer 36 is adjusted to have the value larger than that of the first insulation layer patterns 32.

When the third insulation layer patterns 38a and the second insulation layer patterns 36a are formed, contaminant particles are generated. The contaminants may remain on the third insulation layer patterns 38a and on the second insulation layer patterns 38b, thereby causing failures in subsequent processes.

Therefore, a cleaning process for the third insulation layer patterns 38a and the second insulation layer patterns 36a is preferably performed. The cleaning process is preferably a wet cleaning process that uses an SC-1 solution or an HF solution. Though the two solutions may be independently used, it is preferable to sequentially use the HF solution and then the SC-1 solution during the cleaning process. Here, the cleaning process using the SC-1 solution is performed at the temperature of about 70° C. for about 7 minutes. Then, the cleaning process is performed using the HF solution is performed at a temperature of about 70° C. for about 160 seconds.

When the third insulation layer patterns 38a and the second insulation layer patterns 38b are cleaned, the first insulation layer patterns 32 may be damaged. Particularly, the first insulation layer patterns 32 near the upper portions of the contact plugs 34 may be damaged.

Therefore, a protection layer (not shown) for protecting the damaged first insulation layer patterns 32 is preferably formed on the damaged portions of the first insulation layer patterns 32. For example, the protection layer includes a silicon nitride film or an aluminum oxide film. Though the two films are independently formed to complete the protection layer, a composite film including a silicon nitride film and an aluminum oxide film may be formed to complete the protection layer. In particular, the protection layer is formed as follows.

The protection layer is continuously formed on the third insulation layer patterns 38a, on the sidewalls of the third contact holes 38b, and on the sidewalls and the bottom faces of the second contact holes 36b. Then, the protection layer on the third insulation layer patterns 38a is removed by a chemical mechanical polishing (CMP) process. As a result, the protection layer remains on the sidewalls of the third contact holes 38b and on the sidewalls and the bottom faces of the second contact holes 36b. Though the protection layer may be formed on the damaged portions of the first insulation layer patterns 32 only, the protection layer is preferably formed on the sidewalls of the third contact holes 38b and on the sidewalls and the bottom faces of the second contact holes 36b.

The protection layer prevents the formation of a pattern bridge between adjacent contact plugs 34 caused by the damage of the first insulation layer patterns 32 near the upper portions of the contact plugs 34.

A conductive film for the bottom electrodes of the capacitors is continuously formed on the sidewalls of the third contact holes 38b and on the sidewalls and the bottom faces of the second contact holes 36b. Particularly, the conductive film is continuously formed on the third insulation layer patterns 38a, on the sidewalls of the third contact holes 38b, and on the sidewalls and the bottom faces of the second contact holes 36b. Then, the conductive film on the third insulation layer patterns 38a is removed by a CMP process. As a result, the conductive film remains to form bottom electrodes 40. The bottom electrodes 40 are formed on the sidewalls of the third contact holes 38b, and on the sidewalls and the bottom faces (adjacent to the contact plugs 34) of the second contact holes 36b. Each of the bottom electrodes 40 has an upper node 40a and a lower node 40b wherein the critical dimension of the lower node 40b is larger than that of the upper node 40a because the critical dimension of the second contact hole 36b is larger than that of the third contact hole 38b.

Figure 4:
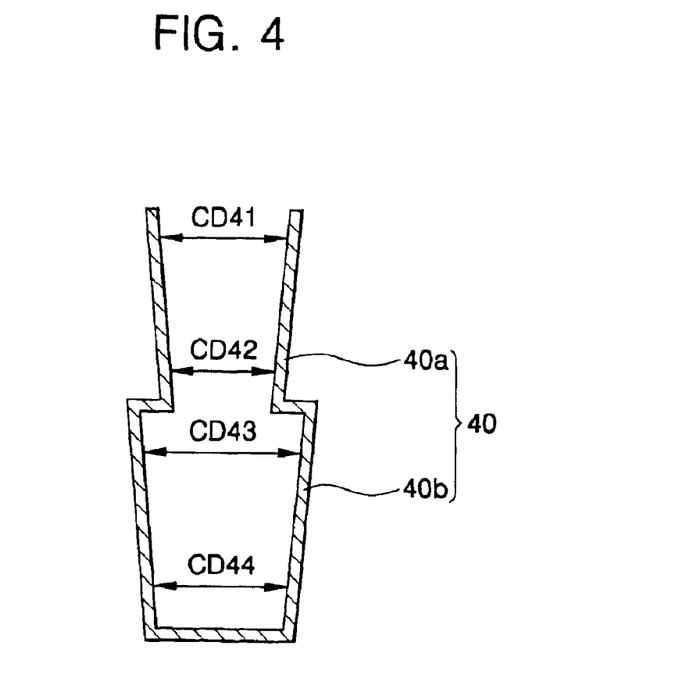
FIG. 4 is an enlarged cross-sectional diagram illustrating the critical dimension of the bottom electrode of a cylindrical shaped capacitor fabricated according to another embodiment of the invention.

FIG. 4 is an enlarged cross-sectional diagram illustrating the critical dimension of the bottom electrode of the cylindrical shaped capacitor fabricated according to another embodiment of the invention.

Referring to FIG. 4, the critical dimension of the upper portion (CD41) of the upper node 40a of the bottom electrode 40 is larger than that of the lower portion (CD42) of the upper node 40a. In addition, the critical dimension of the upper portion (CD43) of the lower node 40b of the bottom electrode 40 is larger than that of a lower portion (CD44) of the lower node 40b. Thus, the bottom electrode 40 has a geometrically stable structure.

The structures having the conductive film may be used as metal wirings of a semiconductor device. In particular, an interlayer dielectric layer is formed on the structure having the conductive film after the conductive film is formed. Then, the interlayer dielectric layer is etched to form an interlayer dielectric layer pattern having a contact hole exposing the conductive film. Next, other films are additionally formed on the resultant structure to be electrically connected to the conductive film. As described above, the conductive film may be used as the metal wirings after performing a series of processes.

Figure 3E:
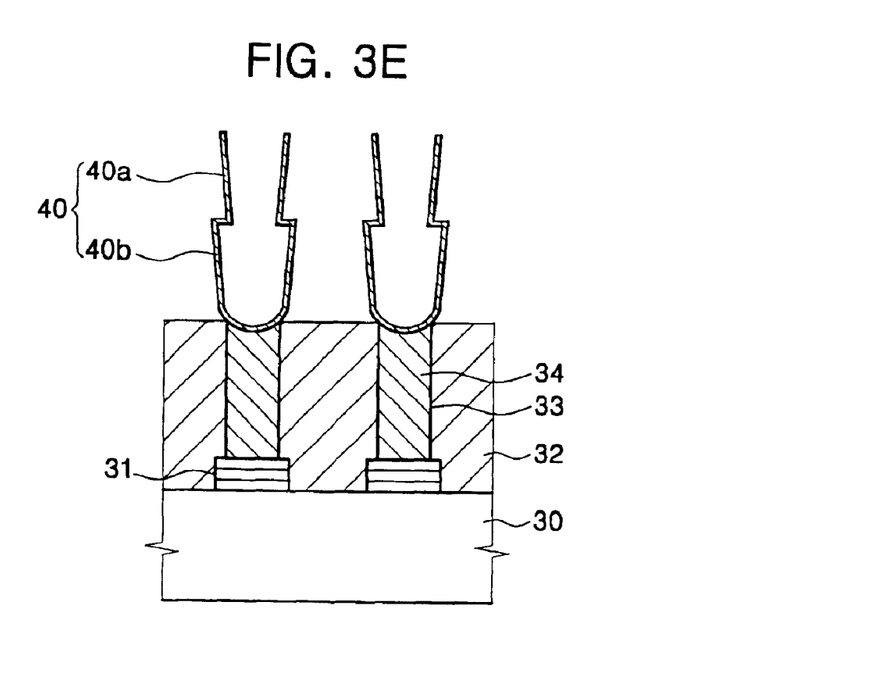

Referring now to FIG. 3E, the second insulation layer patterns 36a and the third insulation layer patterns 38a are removed. Thus, cylindrical shaped bottom electrodes 40 of the capacitors are formed over the substrate 30. Here, the second insulation layer patterns 36a and the third insulation layer patterns 38a are preferably removed by a wet etching process using a LAL solution.

When the protection layer is formed, the protection layer is advantageously removed to complete the bottom electrode 40. In this case, the protection layer is preferably removed by a wet etching process using a LAL solution or a phosphoric acid solution. When the protection layer includes the aluminum oxide film, the wet etching process using the LAL solution is performed to remove the protection layer. Meanwhile, the protection layer includes the silicon nitride film, the wet etching process using the phosphoric acid solution is executed to remove the protection layer.

In addition, the etch stop layer 35 remaining on the first insulation layer patterns 32 is removed when the first insulation layer patterns 32 are exposed according as the second insulation layer patterns 36a and the third insulation layer patterns 38a are removed. In the case where the etch stop layer 35 includes a material substantially identical to that of the protection layer, the etch stop layer 35 is simultaneously removed along with the protection layer.

Therefore, the etch stop layer 35 is advantageously removed by the wet etching process using the LAL solution or the phosphoric acid solution.

According to an embodiment of the invention, the pattern bridge between the contact plugs may be prevented by adjusting the etching selectivity of the insulation layer patterns formed on the upper portions of the contact plugs. The likelihood of a pattern bridge is also reduced by preventing the etching of the insulation layer patterns on the upper portions of the contact plugs. Although the insulation layer patterns on the upper portions of the contact plugs are slightly damaged, the formation of the pattern bridge between the contact plugs can be efficiently prevented because the insulating protection layer is formed on the damaged insulation layer patterns. Therefore, the pattern bridge between contact plugs that is frequently caused during the formation of the cylindrical shaped capacitor can be effectively prevented.

Hereinafter, a method of forming a protection layer in accordance with another embodiment of the invention will be described.

Figure 5:
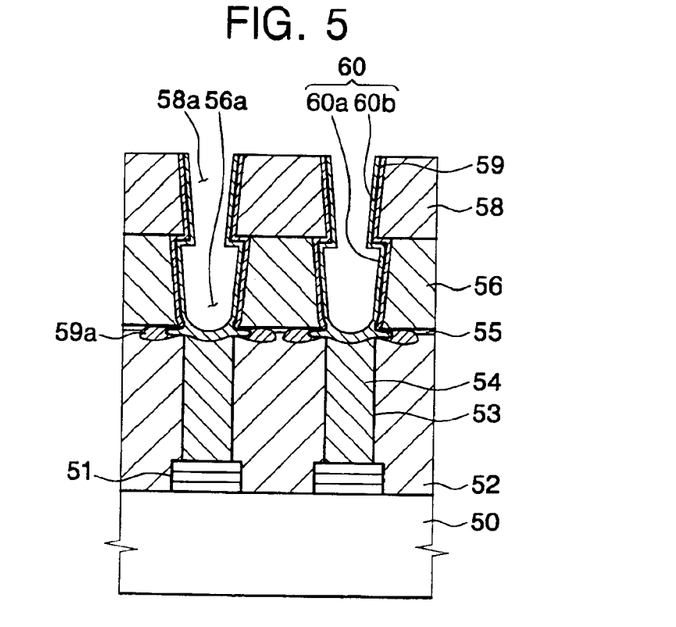
FIGS. 5 and 6 are cross-sectional diagrams illustrating a method of forming the bottom electrode of a cylindrical shaped capacitor having a protection layer pattern according to yet another embodiment of the invention.
Figure 6:
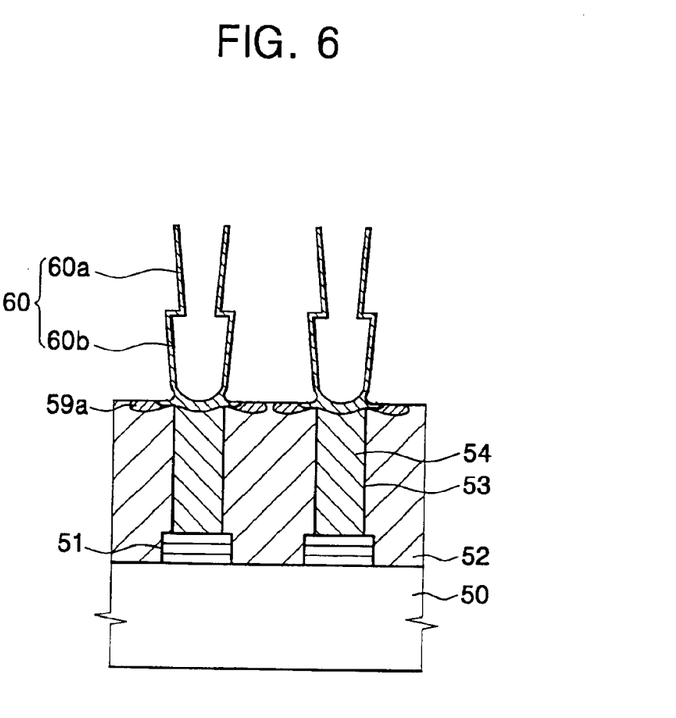

FIGS. 5 and 6 are cross-sectional diagrams illustrating a method of forming the bottom electrode of a cylindrical shaped capacitor having a protection layer pattern according to another embodiment of the invention.

Referring to FIG. 5, first insulation layer patterns 52 having first contact holes 53 are formed on a semiconductor substrate 50. A conductive material is deposited on the first insulation layer patterns 52 to fill up the first contact holes 53 so that contact plugs 54 for bottom electrodes of capacitors are formed in the first contact holes 53.

Second insulation layer patterns 56 and third insulation layer patterns 58 are successively formed on the first insulation layer patterns 52. The second insulation layer patterns 56 have second contact holes 56a exposing the contact plugs 54 and the third insulation layer patterns 58 have third contact holes 58a. Alternatively, an etch stop layer 55 may be additionally formed between the first insulation layer patterns 52 and the second insulation layer patterns 56.

The first insulation layer patterns 52, the contact plugs 54, the second insulation layer patterns 56 and the third insulation layer patterns 58 are formed by the processes identical to those described in FIGS. 3A to 3D.

When the second insulation layer patterns 56 and the third insulation layer patterns 58 are formed, the first insulation layer patterns 52 near the upper portions of the contact plugs 54 may be damaged. If the first insulation layer patterns 52 are seriously impaired, pattern bridges may generate between adjacent contact plugs 54. Thus, a protection layer 59 is formed on the sidewalls of the third contact holes 58a and on the sidewalls and bottom faces of the second contact holes 56a. The protection layer 59 is formed as follows.

A thin film for the protection layer 59 is continuously formed on the third insulation layer patterns 58, on the sidewalls of and the third contact holes 58a, and on the sidewalls and the bottom faces of the second contact holes 56a. Next, the thin film on the third insulation layer patterns 58 is removed by a CMP process to form the protection layer 59. Though the protection layer 59 may be formed on the damaged portions of the first insulation layer patterns 52 only, the protection layer 59 is preferably formed on the sidewalls of the third contact holes 58a, and on the sidewalls and the bottom surfaces of the second contact holes 56a.

When the first insulation layer patterns 52 are impaired, the protection layer 59 is formed on the impaired portions of the first insulation layer patterns 52. For example, the protection layer 59 includes a silicon nitride film or an aluminum oxide film. Though these two films are independently utilized to form the protection layer 59, a composite film including a silicon nitride film and an aluminum oxide film may be employed to form the protection layer 59.

A conductive film for the bottom electrodes 60 of capacitors is formed and processed to form the bottom electrodes 60 including lower nodes 60b and upper nodes 60a. Here, the bottom electrodes 60 are formed in accordance with the processes described in FIGS. 3D and 3E.

Referring to FIG. 6, after the second insulation layer patterns 56 and the third insulation layer patterns 58 are removed, the protection layer 59 and the etch stop layer 55 exposed according to the removal of the second and third insulation layer patterns 56 and 58 are removed. The second insulation layer patterns 56, the third insulation layer patterns 58, the protection layer 59, and the etch stop layer 55 are removed by processes substantially identical to those described in FIG. 3E. In this case, portions of the protection layer 59 remain on the first insulation layer patterns 52 to form protection layer patterns 59a covering the damaged portions of the first insulation layer patterns 52. As a result, the bottom electrodes 60 having cylindrical shapes are formed over the substrate 50. Each of the bottom electrodes 60 includes the pad 51, the contact plug 54, the protection layer pattern 59a, the upper node 60a and the lower 60b. The upper and lower nodes 60a and 60b have cylindrical shapes. The upper node 60a is connected to the lower node 60b. Here, the upper and lower nodes 60a and 60b are integrally formed. Additionally, the critical dimension of the lower node 60b is preferably larger than that of the upper node 60a.

More specially, the protection layer patterns 59a are formed near the upper portions of the contact plugs 54 of the bottom electrodes 60, thereby preventing the pattern bridge between the contact plugs 54 due to the protection layer patterns 59a. Therefore, the pattern bridge between contact plugs, which often occurs during the formation of the cylindrical shaped capacitor, is prevented by the protection layer patterns 59a.

Hereinafter, it will be described that a method of fabricating a DRAM device by employing the processes for forming the bottom electrode of the cylindrical shaped capacitor.

FIGS. 7A to 7D are cross-sectional diagrams illustrating a method of fabricating a DRAM device according to still another embodiment of the present invention.

Figure 7A:
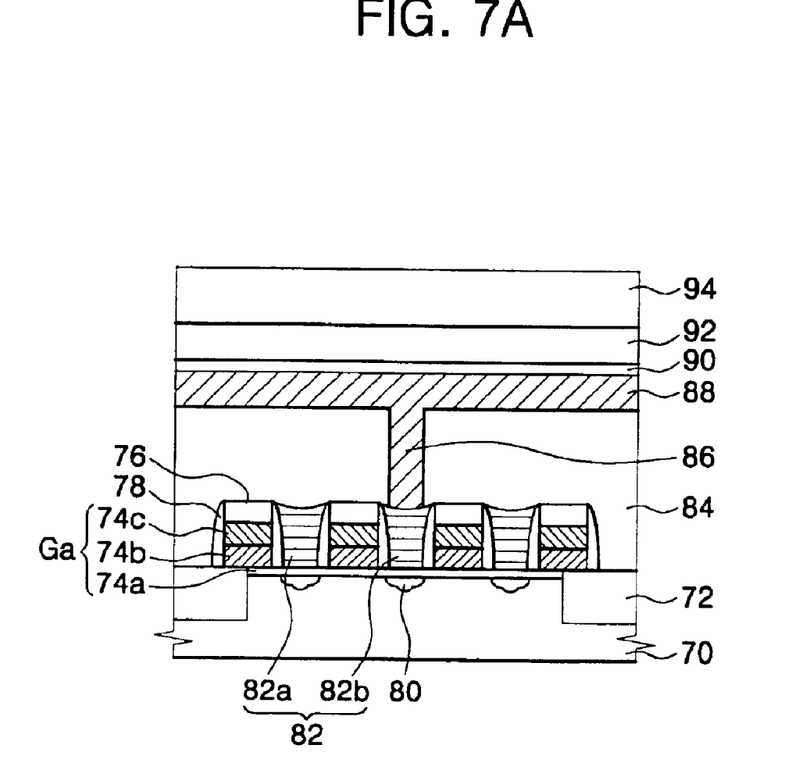
FIGS. 7A to 7D are cross-sectional diagrams illustrating a method of fabricating a DRAM device according to still another embodiment of the invention.

Referring to FIG. 7A, there is provided a substrate 70 having a trench wherein an isolation layer 72 is formed. Gate electrodes Ga are formed in an active region of the substrate 70. Each of the gate electrodes Ga includes a gate silicon oxide film pattern 74a, a polysilicon film pattern 74b, and a tungsten silicide film pattern 74c.

Lightly doped source/drain regions 80 are formed at portions of the substrate 70 exposed between the gate electrodes Ga by an ion implantation process. Spacers 78a are formed on the sidewalls of the gate electrode Ga, respectively. In addition, capping layer patterns 76 are formed on top faces of the gate electrodes Ga, respectively. Heavily doped source/drain regions are then formed at the exposed portions of the substrate 70 by an additional ion implantation process. As a result, gate electrodes Ga and lightly doped drain (LDD) source/drain regions 80 are completed on the substrate 70. Here, the LDD source/drain regions 80 correspond to contact regions such as capacitor contact regions and bit line contact regions.

Pads 82 are formed on the contact regions of the substrate 70 between the gate electrodes Ga by filling a polysilicon film between the gate electrodes Ga. Each of the pads 82 includes a first pad 82a for the bottom electrode of a capacitor and a second pad 82b for a bit line. Particularly, the polysilicon film is formed on the contact regions of the substrate 70 and on the gate electrodes Ga. A CMP process is performed on the polysilicon film until the capping layer patterns 76 of the gate electrodes Ga are exposed. Portions of the polysilicon remain only on the contact regions, thereby forming the pads 82 on the contact regions (that is, source/drain regions 80).

After a first interlayer dielectric layer 84 is formed on the resulting structure, the first interlayer dielectric layer 84 is planarized by a CMP process or an etch-back process. Next, a bit line contact hole exposing the second pad 82b for a bit line 88 is formed by a photolithography process.

A conductive material is deposited to fill up the bit line contact hole so that a bit line contact plug 86 is formed in the bit line contact hole. The bit line 88 is formed on the first interlayer dielectric layer 84 and is electrically connected to the bit line contact plug 86. An oxidation preventing layer 90 is then formed on the bit line 88 to prevent the oxidation of the bit line 88 during subsequent processes.

Next, after a second interlayer dielectric layer 92 is formed on the oxidation preventing layer 90, the second interlayer dielectric layer 92 is planarized by a CMP process. The second interlayer dielectric layer 92 is planarized to have a thickness of about 500 Å. Because the second interlayer dielectric layer 92 has a relatively thin thickness of about 500 Å, the bit line 88 may be damaged during subsequent processes. Therefore, a capping layer 94 having a thickness of about 2,000 Å is formed on the second interlayer dielectric layer 92 after the planarization of the second interlayer dielectric layer 92. The capping layer 94 includes a BPSG film formed by a chemical vapor deposition process. In this case, the BPSG film contains about 4.0% by weight of boron and about 3.5% by weight of phosphorous.

Figure 7B:
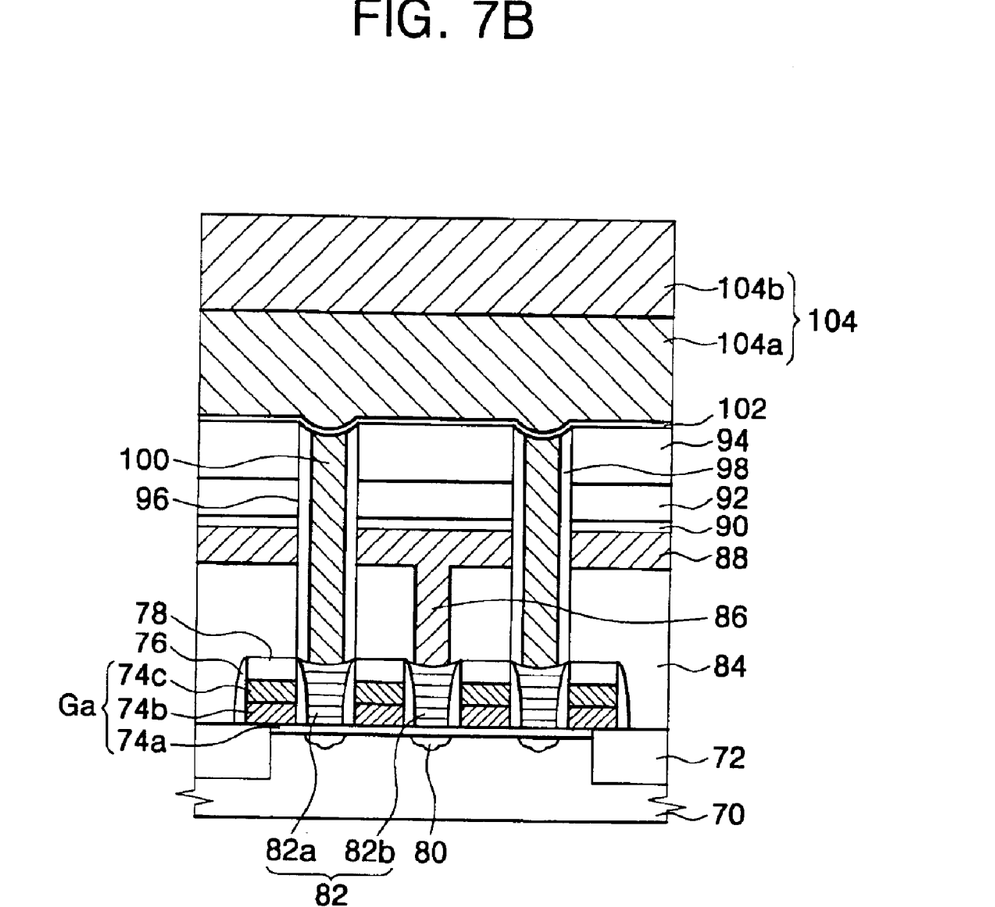

Referring to FIG. 7B, contact holes 96 are formed to expose the first pads 82*a* for the bottom electrode. The contact holes 96 are formed by a dry etching process using a photoresist pattern as an etch mask.

A first wet cleaning process is performed for about 100 seconds using an HF solution diluted with water by a ratio of about 200:1. Then, a second wet cleaning process is executed for about 180 seconds using an SC-1 solution.

Spacers 98 are formed on the sidewalls of the contact holes 96. In particular, a middle temperature oxide (MTO) film and a silicon nitride film are continuously formed on the sidewalls and bottom faces of the contact holes 96 and on the capping layer 94. Next, the MTO film and the silicon nitride film on the bottom faces of the contact holes 96 and the capping layer 94 are removed by an etching process, thereby forming the spacers 98 on the sidewalls of the contact holes 96.

Contact plugs 100 for the bottom electrode are formed in the contact holes 96 by filling the contact holes 96 using a conductive material. A silicon oxide layer is formed on the contact plugs 100 and on the capping layer 94 to a thickness of about 450 Å. The silicon oxide layer serves as an etch stop layer 102.

A molding layer 104 is formed on the etch stop layer 102. The molding layer 104 will be used to form the bottom electrodes having cylindrical shaped nodes by a molding process. The molding layer 104 includes a BPSG film 104*a* and a plasma enhanced TEOS (PE-TEOS) film 104*b*. The BPSG film 104*a* contains about 2.50% by weight of boron and about 2.45% by weight of phosphorous. The molding layer 104 has an overall thickness of about 15,000 Å.

Figure 7C:
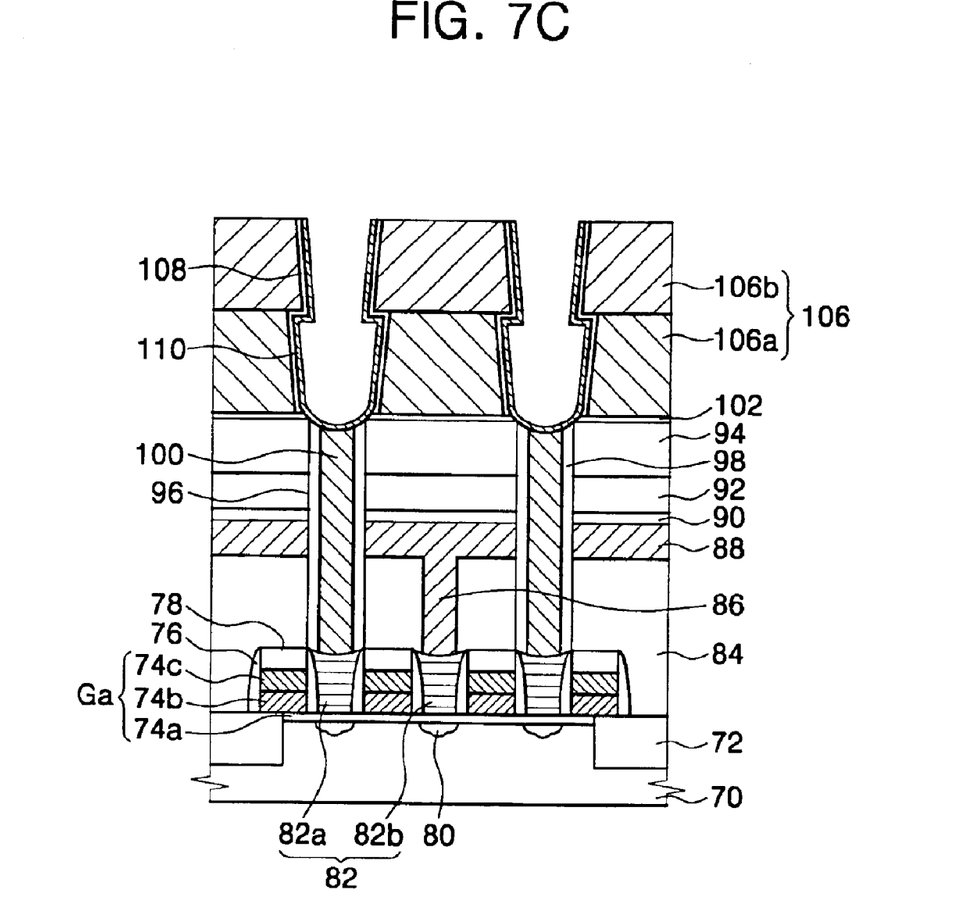

Referring to FIG. 7C, the molding layer 104 is etched to form molding layer patterns 106 including BPSG film patterns 106*a* and PE-TEOS film patterns 106*b*. Simultaneously, contact holes are formed through the molding layer patterns 106. The BPSG film patterns 106*a* are positioned at lower portions of the contact holes while the PE-TEOS film patterns 106*b* are positioned at upper portions of the contact holes. Here, the critical dimensions of the BPSG film patterns 106*a* are larger than those of the PE-TEOS film patterns 106*b*. That is, the lower portions of the contact holes are wider than the upper portions of the contact holes.

Because the capping layer 94 includes more boron and phosphorous than the BPSG film patterns 106*a* of the molding layer patterns 106, the etching process for forming the molding layer pattern 106 may be insufficiently performed.

After a primary wet cleaning process is performed on the resultant structure at a temperature of about 70° C. using an HF solution diluted with water by ratio of about 200:1 for about 100 seconds, a secondary wet cleaning process is performed concerning the resultant structure at a temperature of about 70° C. using an SC-1 solution for about 180 seconds.

After forming the molding layer patterns 106, a protection layer 108 is formed on the sidewalls of the contact holes that penetrate the molding layer patterns 106 to prevent the pattern bridge between contact plugs 100. A conductive film for the bottom electrodes 110 is formed on the surface of the protection layer 108 and on the bottom faces of the contact holes.

Alternatively, the conductive film for the bottom electrodes 110 may be employed as metal wirings. Namely, an interlayer dielectric layer is formed on the resultant structure having the conductive film for the bottom electrodes 110. Then, the interlayer dielectric layer is patterned to form interlayer dielectric layer patterns having contact holes exposing the conductive film for the bottom electrodes 110. An additional conductive film is formed on the interlayer dielectric layer patterns to electrically connect the conductive film for the bottom electrodes 110, thereby utilizing the conductive film for the bottom electrodes 110 as the metal wirings.

Figure 7D:
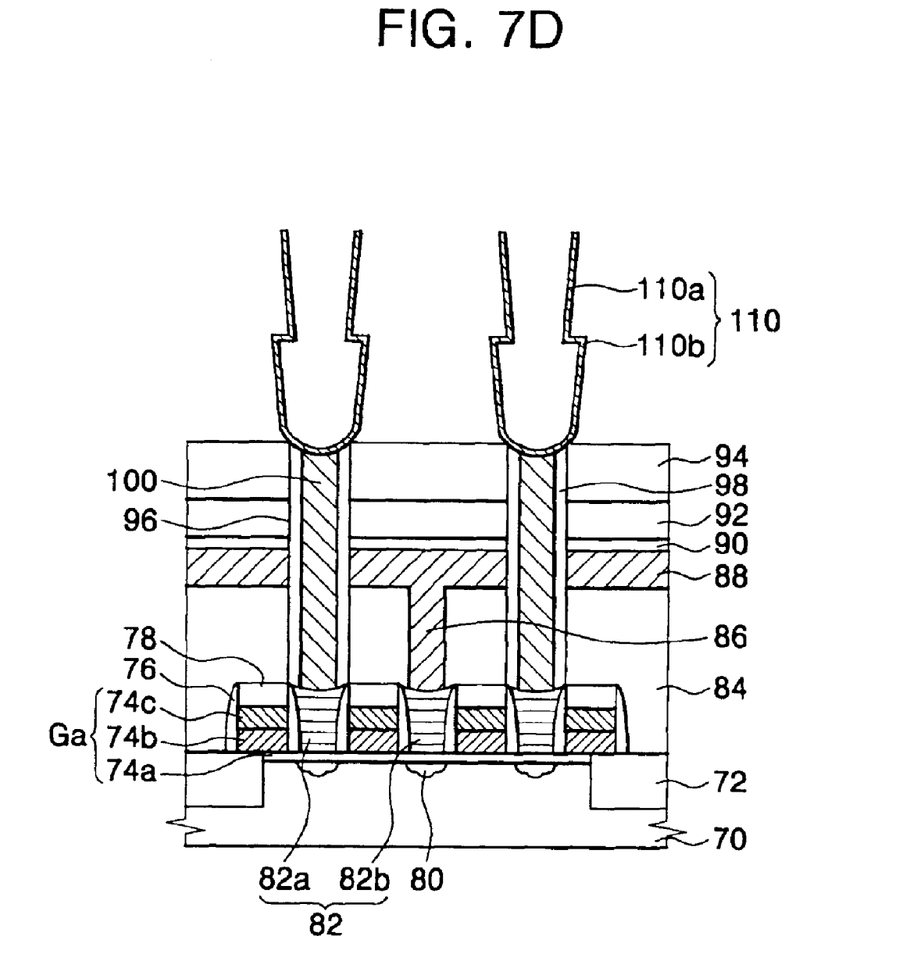

Referring to FIG. 7D, the molding layer patterns 106, the protection layer 108 and the etch stop layer 102 remaining on the capping layer 94 are sequentially removed. Thus, the bottom electrodes 110 are formed over the substrate 70. Here, the bottom electrodes 110 include upper nodes 110*a* and lower nodes 110*b*, respectively. The nodes 110*a* and 110*b* are electrically connected to the first pads 82*a* through the contact plugs 100.

Thereafter, dielectric layers and top electrodes are formed on the bottom electrodes 110 to complete the capacitors having the cylindrical shapes. As a result, a DRAM cell is formed on the substrate 70, which has transistors including the gate electrodes Ga and the source/drain region 80, a bit line for an electrical connection, and the capacitor having the cylindrical shapes.

According to an embodiment of the invention, the insulation layer near the upper portions of the contact plugs for the bottom electrodes is not completely etched, preventing the bridge between the contact plugs when the cylindrical shaped capacitors are formed. Although the insulation layer near the upper portions of the contact plugs is etched somewhat, the bridge between the contact plugs may be prevented due to the remaining insulation layer near the upper portions of the contact plugs.

The method of the invention may be advantageously employed to form a cylindrical shaped capacitor having a high height while simultaneously preventing the capacitor from collapsing.

Additionally, a semiconductor device including the capacitor has improved electrical reliability because bridges between the contact plugs caused by the etching of the upper portions of the contact plugs are prevented.

Furthermore, the structure having the conductive film for the nodes may be sufficiently employed as metal wirings of a semiconductor device.

Embodiments of the invention will now be described in a non-limiting way.

In one aspect of the invention, a first insulation layer pattern having a first etching rate and a first contact hole is formed on a substrate. A contact plug is formed in the contact hole, and a second insulation layer having a second etching rate is formed on the first insulation layer pattern and on the contact plug. The second insulation layer has a second etching rate higher than the first etching rate. The second insulation layer is etched to form a second insulation layer pattern having a second contact hole exposing the contact plug and a portion of the first insulation layer pattern near the contact plug. The etching amount of portions of the first insulation layer pattern is reduced in accordance with the etching rate difference between the second etching rate and the first etching rate. A conductive film is continuously formed on the sidewall and on the bottom face of the second contact hole. The second insulation layer pattern is removed.

When the second insulation layer is etched, the etching rate of the first insulation layer pattern is adjusted to be smaller than that of the second insulation layer. Therefore, the first insulation layer pattern near the upper portion of the contact plug may not be etched to some degree.

According to an embodiment of the invention, the bridge that is usually generated during etching of the upper portion of the contact plug is prevented. A cylindrical shaped capacitor having a bottom electrode with a high height may be formed without danger of collapsing. As a result, the reliability of semiconductor devices that include the capacitor may be improved.

In another aspect of the invention, a first insulation layer pattern having a first contact hole is formed on a substrate. A contact plug for a bottom electrode of a capacitor is formed in the contact hole, and a second insulation layer pattern is formed on the first insulation layer pattern. The second insulation layer pattern has a second contact hole exposing the contact plug. A protection layer is formed on a portion of the first insulation pattern exposed by the second contact hole and on a sidewall of the second contact hole. A conductive film for the bottom electrode is continuously formed on the protection layer and on the contact plug. The second insulation layer pattern is removed, and the protection layer is then partially removed.

According to another embodiment of the invention, the portion of the first insulation layer pattern near the upper portion of the contact plug may be slightly etched during the processes for forming the capacitor. The protection layer formed near the first insulation layer pattern prevents the generation of a bridge between the contact plugs. Therefore, the capacitor has a cylindrical shape wherein the height of the capacitor is augmented without danger of collapse. As a result, the reliability of a semiconductor device including the capacitor can be enhanced.

In still another aspect of the invention, a bottom electrode of a capacitor includes a contact plug formed on a substrate, a node formed on the upper portion of the contact plug, and a protection layer pattern formed near the contact plug. The contact plug is electrically connected to the node, and the protection layer pattern prevents the electrical connection between the contact plug and an adjacent contact plug.

According to still another embodiment of the invention, the bottom electrode includes the protection layer pattern to prevent the formation of a bridge between adjacent contact plugs. When the bottom electrode having the protection layer pattern is employed for the capacitor having a cylindrical shape, the capacitor can have improved electric characteristics as well as stable structure.

Exemplary embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a bottom electrode of a capacitor of a semiconductor device comprising:

forming a first insulation layer pattern having a first contact bole;

forming a contact, plug in the first contact hole;

forming a second insulation layer pattern on the first insulation layer pattern, the second insulation layer pattern having a second contact hole exposing the contact plug and a portion of the first insulation layer pattern;

forming a protection layer on a sidewall of the second contact hole and on the portion of the first insulation layer pattern;

forming a conductive film for the bottom electrode continuously on the protection layer and on the contact plug;

removing the second insulation layer pattern; and partially removing the protection layer so that a portion of the protection layer remains near the contact plug.

2. The method of claim 1, wherein the first insulation layer pattern has a first etching rate that is smaller than a second etching rate of the second insulation layer pattern.

3. The method of claim 2, wherein the first insulation layer pattern comprises a BPSG film including about 3.5 to 4.5% by weight of boron and about 3.3 to 3.7% by weight of phosphorous, and the second insulation layer pattern comprises a BPSG film including about 2.3 to 2.7% by weight of boron and about 2.25 to 2.65% by weight of phosphorous.

4. The method of claim 1, further comprising:

performing a first cleaning process after forming the first insulation layer pattern; and performing a second cleaning process after forming the second insulation layer pattern.

5. The method of claim 4, wherein performing a first cleaning process and performing a second cleaning process comprise:

performing a process chosen from the group consisting of a cleaning process using a standard cleaning 1 (SC-1) solution, a cleaning process using a hydrogen fluoride (HF) solution, or a cleaning process sequentially using the standard cleaning 1 (SC-1) solution and the hydrogen fluoride (HF) solution.

6. The method of claim 1, further comprising:

forming a spacer on a sidewall of the first contact hole.

7. The method of claim 6, wherein forming the spacer on the sidewall of the first contact hole comprises:

forming a spacer on the sidewall and a bottom face of the first contact hole and on the first insulation layer pattern, wherein the spacer comprises a film chosen from the group consisting of a silicon nitride film, an oxide film, and a composite film that includes a silicon nitride film and an oxide film; and etching the spacer.

8. The method of claim 1, further comprising:

forming an etch stop layer on the first insulation layer pattern and on the contact plug.

9. The method of claim 8, wherein forming the etch stop layer comprises:

forming a film chosen from the group consisting of a silicon nitride film, an oxide film, and a composite film that includes a silicon nitride film and en oxide film.

10. The method of claim 9, further comprising:

removing the etch stop layer.

11. The method of claim 10, wherein removing the etch stop layer comprises:

removing the etch stop layer with a wet etching process that uses a phosphoric acid solution if the etch stop layer comprises the silicon nitride film;

removing the etch stop layer with a wet etching process that uses a fluorine-containing solution if the etch stop layer comprises the oxide film; and removing the etch stop layer with a wet etching process that sequentially uses the phosphoric acid solution and the fluorine-containing solution if the etch stop layer comprises the composite film.

12. The method of claim 1, wherein forming a protection layer comprises:
forming a film chosen from the group consisting of a silicon nitride film, an aluminum oxide film, and a composite film that includes a silicon nitride film and an aluminum oxide film.

13. The method of claim 12, wherein partially removing the protection layer comprises:
partially removing the protection layer with a wet etching process that uses a phosphoric acid solution if the protection layer comprises the silicon nitride film;
partially removing the protection layer with a wet etching process that uses a LAL solution when the protection layer comprises the aluminum oxide film;
partially removing the protection layer with a wet etching process that sequentially uses the phosphoric acid solution and the fluorine-containing solution if the protection layer comprises the composite film.

14. The method of claim 1, wherein forming a second insulation layer pattern comprises forming the second insulation layer pattern with a process chosen from the group consisting of a dry etching process and a wet etching process.

15. The method of claim 3, wherein removing the second insulation layer pattern comprises removing the second insulation layer pattern with a wet etching process that uses a fluorine-containing solution.

16. The method of claim 2, further comprising:
forming a third insulation layer with a third etching rate on the second insulation layer pattern, wherein the third etching rate is less than the second etching rate; and
forming a third insulation layer pattern having a third contact hole exposing a portion of the second insulation layer pattern where the second contact hole is formed by etching the third insulation layer, wherein a critical dimension of the third contact hole is smaller than a critical dimension of the second contact hole in accordance with an etching rate difference between the third etching rate and the second etching rate.

17. The method of claim 16, wherein forming a third insulation layer comprises forming a TEOS layer.

18. The method of claim 16, wherein forming a third insulation layer pattern comprises using a process chosen from the group consisting of a dry etching process and a wet etching process.

19. The method of claim 18, further comprising:
removing the third insulation layer pattern.

20. The method of claim 19, wherein removing the third insulation layer pattern comprises:
removing the third insulation layer pattern with a wet etching process that uses a fluorine-containing solution.

* * * * *

UNITED STATES PATENT AND TRADEMARK OFFICE
CERTIFICATE OF CORRECTION

PATENT NO. : 6,930,014 B2
APPLICATION NO. : 10/670485
DATED : August 16, 2005
INVENTOR(S) : Kim et al.

Page 1 of 1

It is certified that error appears in the above-identified patent and that said Letters Patent is hereby corrected as shown below:

column 13, line 61, please replace "contact bole" with --contact hole -- column 13, line 62, please replace "contact, plug" with --contact plug-- column 14, line 54, please replace "en oxide film" with --an oxide film-- column 16, line 21, please replace "claim 18" with --claim 17--

Signed and Sealed this

Fifteenth Day of August, 2006

JON W. DUDAS
*Director of the United States Patent and Trademark Office*